United States Patent [19]
Zuk

[11] 4,001,608
[45] Jan. 4, 1977

[54] ECL SWITCHING CIRCUIT FOR PRODUCING NONCOMPLEMENTARY, TIME COINCIDENT SIGNALS

[75] Inventor: Borys Zuk, New Brunswick, N.J.

[73] Assignee: RCA Corporation, New York, N.Y.

[22] Filed: May 12, 1975

[21] Appl. No.: 576,608

[52] U.S. Cl. .............................. 307/268; 307/273; 307/254

[51] Int. Cl.$^2$ ...................................... H03K 17/00

[58] Field of Search ..... 307/268, 215, 254, DIG. 7, 307/293, 273; 330/30 D

[56] References Cited
UNITED STATES PATENTS

| | | | |
|---|---|---|---|
| 3,259,761 | 7/1966 | Narud et al. | 307/215 |
| 3,739,197 | 6/1973 | Prill et al. | 330/30 D |

Primary Examiner—Stanley D. Miller, Jr.
Assistant Examiner—B. P. Davis
Attorney, Agent, or Firm—H. Christoffersen; Henry I. Schanzer

[57] ABSTRACT

An emitter coupled logic (ECL) circuit for producing noncomplementary, time coincident signals. The circuit includes a differential amplifier stage having first and second inputs and first and second outputs with a pulse forming network coupled between the two outputs. In response to an input signal applied between the inputs, the voltage at the first output makes a transition from a first level to a second level and the voltage at the second output makes a transition from the second level to the first level. The network, in response to the changes in the voltage levels at the outputs, causes the restoration of the first level at the first output a given time delay after its transition to the second level, notwithstanding the presence of the input signal.

9 Claims, 2 Drawing Figures

ECL SWITCHING CIRCUIT FOR PRODUCING NONCOMPLEMENTARY, TIME COINCIDENT SIGNALS

This invention relates to switching circuits and in particular to a circuit which can produce time coincident non-complementary output signals.

In response to an excitation signal, some circuits are required to produce signals having a high degree of time coincidence but which do not have similar or complementary wave shapes. For example, one signal must be a square wave which is at one constant level for a time T1 and at another constant level for a time T2 and another signal must be a sampling pulse having a pulse width which is considerably less than T1 or T2 (i.e. very narrow with respect to T1 or T2). The signals should have a fixed relationship, with the sampling pulse occurring at a relatively precise and fixed point to time along the square wave. Known circuits for shaping signals and for producing synchronous signals require complex circuitry and/or more than one logic gate or do not produce signals having desired voltage levels and/or a high degree of time coincidence.

Circuits embodying the invention include a differential amplifier stage having first and second input terminals and first and second output terminals. Selectively enabled restoring means are coupled to the first output terminal to re-establish a first voltage level at said first output terminal following a transition thereat to a second voltage level. A normally disabled delay circuit is connected to said restoring means for delaying its turn on for a given time period after the delay circuit is enabled. Clamping means are coupled between the delay circuit and the second output terminal for disabling the delay circuit and preventing conduction in the restoring means when the second output terminal is at a second level and for enabling the delay circuit when the second output terminal is at the first level.

In the accompanying drawing.

Figure 1:
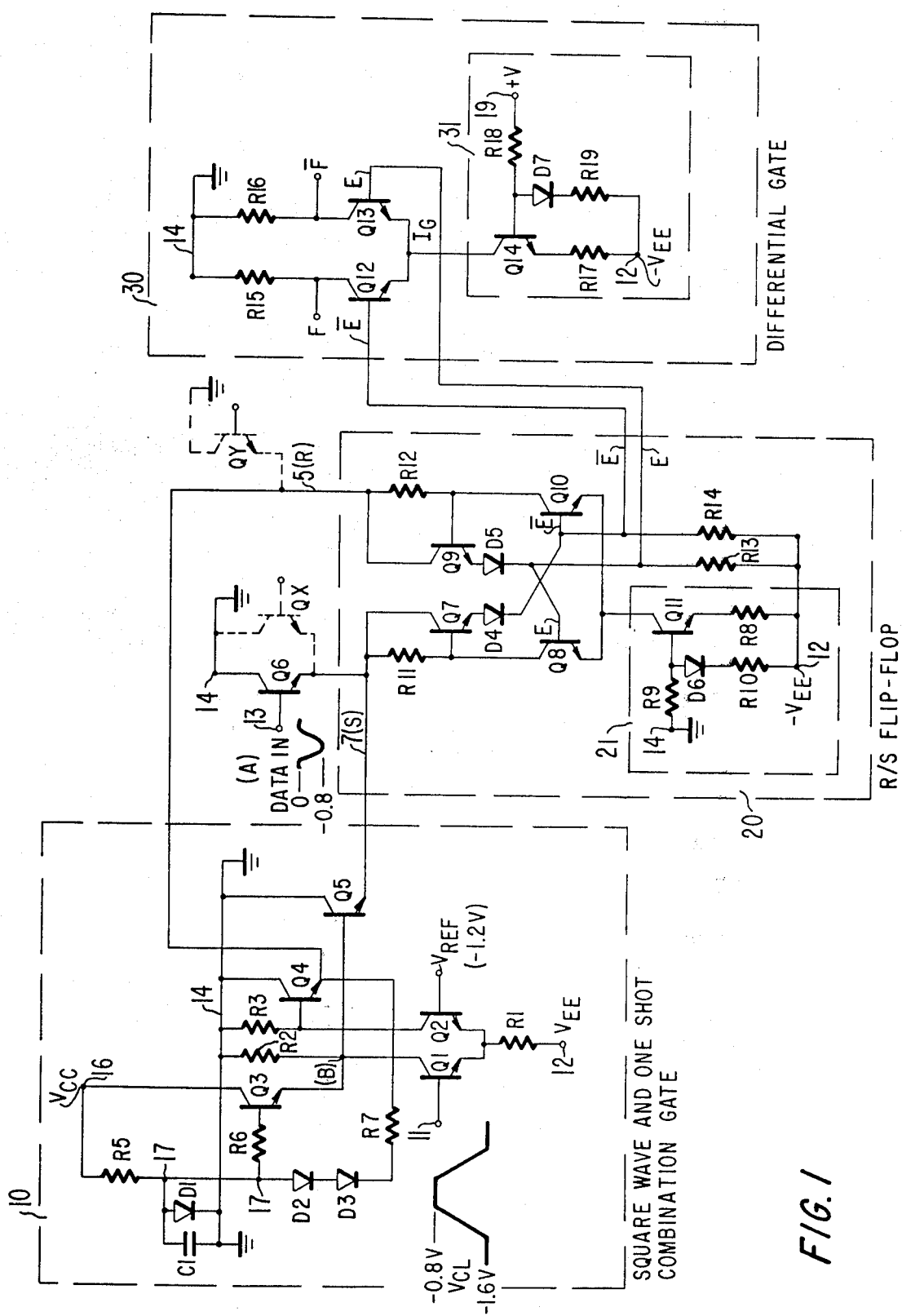
FIG. 1 is a schematic drawing of a circuit embodying the invention.

In the circuit of FIG. 1, a clocking or excitation signal ($V_{CL}$) is applied to terminal 11 of a combinational gate 10 and a data input signal (A) is applied to a terminal 13 outside the gate. In response to the clocking signal, combinational gate 10 produces a square wave (R) on output line 5, which is used to reset a flip-flop 20, and a sampling pulse (B) which is combined with the data input (A) by means of transistors Q5 and Q6 for producing a sampled signal (S) on line 7 which is used to set flip-flop 20. A differential gate circuit 30 senses the state of the flip-flop and produces output pulses (F, $\overline{F}$) each time the flip-flop is set and then reset.

In the circuit of FIG. 1 NPN bipolar transistors are used to illustrate the invention. However, it is to be understood that the invention may be practiced using any other suitable kind of transistors (e.g. PNP bipolars or insulated-gate field-effect transistors.)

Figure 2:
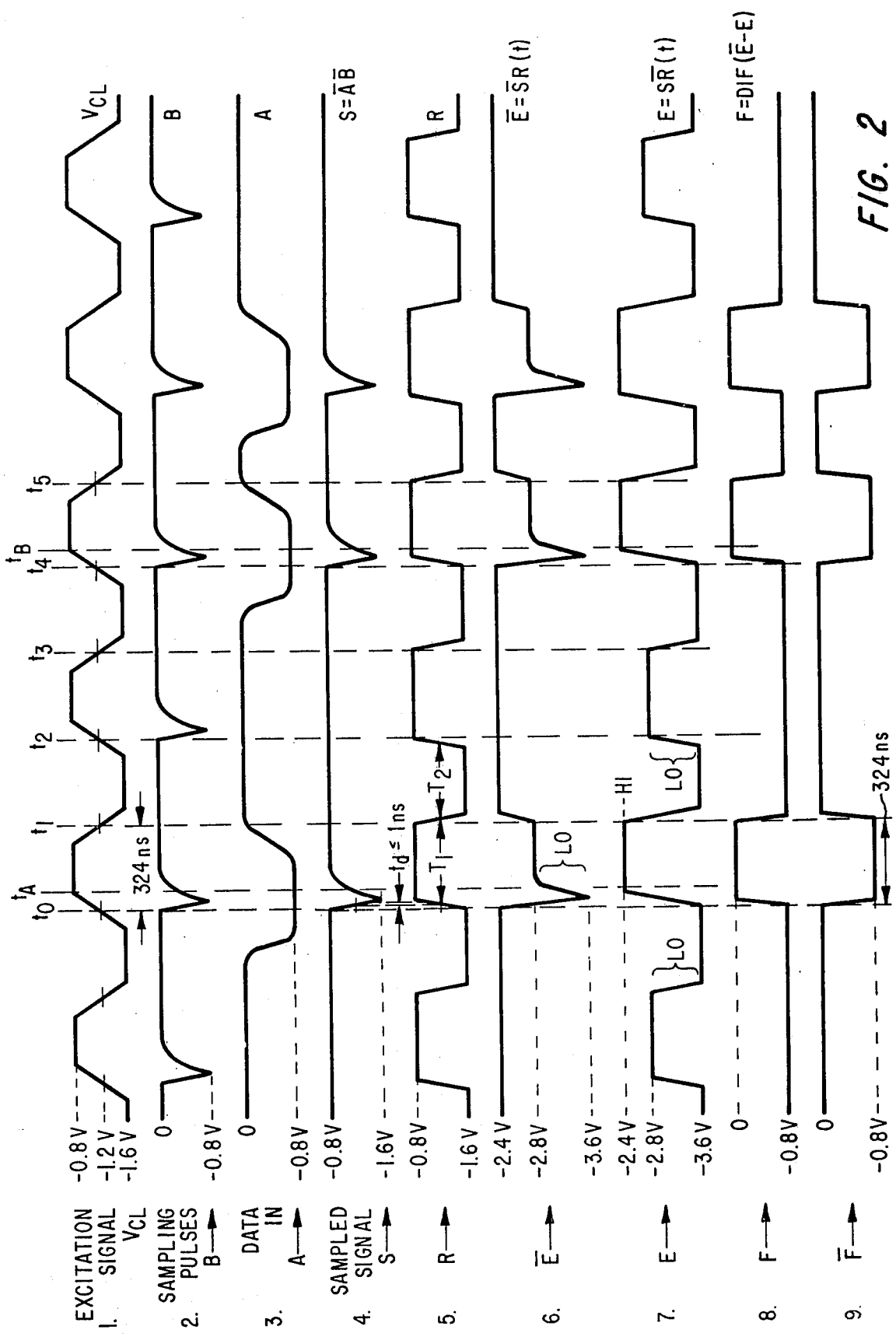
FIG. 2 is a diagram of waveforms present at various points of the circuit of FIG. 1.

The combinational gate 10 includes transistors Q1 and Q2 having their emitters connected in common to one end of resistor R1. The other end of resistor R1 is connected to terminal 12 to which is applied a potential of $-V_{EE}$ volts. Resistors R2 and R3 are connected between the collectors of transistors Q1 and Q2, respectively, and a conductor 14 to which is applied ground potential. The base of transistor Q2 is connected to a point of reference potential ($V_{REF}$) and the base of transistor Q1 is connected to clocking terminal 11. The $V_{CL}$ clocking signals applied to terminal 11 vary in amplitude above and below $V_{REF}$, as shown in FIG. 2. Emitter follower transistors Q4 and Q5 are connected at their bases to the collectors of transistors Q2 and Q1, respectively, and at their collectors to terminal 14. The emitters of transistors Q4 and Q5 are connected to output lines 5 and 7, respectively.

A pulse shaping network is coupled between the emitter of transistor Q4 and the collector of transistor Q1. The network includes: 1) transistor Q3 connected at its collector to terminal 16 to which is applied $+V_{CC}$ volts, at its emitter to the collector of transistor Q1, and at its base through current limiting resistor R6 to terminal 17; 2) a delay circuit comprising timing resistor R5 connected between terminals 16 and 17, and a timing capacitor C1 connected between terminal 17 and conductor 14. In addition, a diode D1 is connected in parallel with capacitor C1 and is poled to conduct current from terminal 17 to conductor 14. Diode D1, whose forward drop ($V_F$) is assumed to be equal to the base-to-emitter drop ($V_{BE}$) of a transistor, prevents the potential at terminal 17 from exceeding $V_{BE}$ volts; and 3) a clamp circuit comprised of diodes D2 and D3 connected in series with resistor R7 between terminal 17 and the emitter of transistor Q4. Diode D2 and D3 are poled to conduct current in the forward direction from terminal 17 to the emitter of transistor Q4 and function to clamp the potential at terminal 17 to approximately $2V_{BE}$ volts above the potential at the emitter of transistor Q4.

Transistor Q6 is connected at its base to data input terminal 13, at its collector to conductor 14, and at its emitter, in common with the emitter of transistor Q5, to line 7. Transistors Q5 and Q6 function as emitter followers and form a negative AND gate which produces a sampled output (S) on line 7 in response to the sampling pulse (B) produced at the collector of transistor Q1 and the Data Input signal (A) applied to terminal 13.

For ease of explaining the operation of the combinational gate 10 of FIG. 1 assume the following conditions: 1) $-V_{EE}$ is $-5$ volts and $+V_{CC}$ is $+5$ volts; 2) the base-to-emitter voltage drop ($V_{BE}$) of each transistor and the forward drop ($V_F$) of each diode is 0.8 volt; 3) $V_{REF}$ is $-1.2$ volts; 4) the signals applied to terminal 11 vary between $-1.6$ volts and $-0.8$ volt; 5) the transistors have high betas; consequently, the impedance looking into their bases is relatively high and little base current is drawn; and 6) the low voltage condition at a point, terminal, or node is defined as logic "0" or "low" and the high voltage condition at that point, terminal, or node is defined as logic "1" or "high".

Assume that the $V_{CL}$ signal applied to the base of transistor Q1 is initially at $-1.6$ volts. For this input condition, transistor Q1 is turned off and transistor Q2 with $-1.2$ volts at its base is turned on. Consequently, the collector potential ($V_{C1}$) of transistor Q1 is at, or close to, zero volts. By proper selection of the ohmic values of resistors R1 and R3, the collector potential ($V_{C2}$) of transistor Q2 goes to approximately $-0.8$ volt. Transistor Q4, functioning as an emitter follower, translates the potential at its base (which is equal to $V_{C2}$) less one $V_{BE}$ drop to its emitter. The emitter potential ($V_{E4}$) of transistor Q4 is then approximately $-1.6$ volts.

Assuming that the voltage drop across each one of clamping diodes D2 and D3 is 0.8 volt and also assuming negligible current through resistor R7, the potential ($V_{17}$) at terminal 17 will be approximately $2V_F$ drops above $V_{E4}$. With $V_{E4}$ at −1.6 volts, $V_{17}$ is at approximately zero volts. Transistor Q3 is nonconducting since its base and its emitter both are at zero volts. Capacitor C1 is maintained in a discharged condition since there is substantially zero volts across it. Therefore, when transistor Q2 is on (Q1 off) the clamp circuit (diodes D2 and D3) prevents the charging of capacitor C1 and the turn on of transistor Q3.

Assume now that $V_{CL}$ makes a transition from −1.6 volts to −0.8 volt. This causes transistor Q1 to turn on and raises the potential at the emitters of transistors Q1 and Q2 from −2.0 volts to −1.6 volts causing transistor Q2 to turn off. The collector current of transistor Q1 flows through resistor R2 causing $V_{C1}$ to drop. Resistor R2 may be made larger than resistor R3 in order to get $V_{C1}$ to drop quickly and more negatively than −0.8 volt. Concurrently, $V_{C2}$ rises to approximately zero volts and, correspondingly, the potential $V_{E4}$ at the emitter of transistor Q4 rises from −1.6 volts to −0.8 volt. When $V_{E4}$ rises to −0.8 volt, $V_{17}$ can rise to +0.8 volt. Indeed, $V_{17}$ rises exponentially from 0 volts towards $+V_{CC}$ volts with a time constant controlled primarily by resistor R5 and capacitor C1. However, when $V_{17}$ reaches +0.8 volt, diode D1 or diodes D2 and D3 clamp the potential at terminal 17 preventing $V_{17}$ from rising above +0.8 volt.

Until $V_{17}$ begins to rise, the base of transistor Q3 is at, or close to, 0 volts. Due to the charge storage effect of capacitor C1, $V_{17}$ does not rise immediately. In addition, current limiting resistor R6, in the base of transistor Q3 limits the current into the base of transistor Q3 thereby slightly increasing its turn on time and thereby ensuring that $V_{C1}$ goes negative.

Transistor Q3, functioning as an emitter follower, translates the potential level at terminal 17 less one $V_{BE}$ drop to the collector of transistor Q1. As $V_{17}$ increases, transistor Q3 causes a corresponding increase in $V_{C1}$. When $V_{17}$ reaches +0.8 volt, transistor Q3 clamps the voltage at the collector of transistor Q1 to approximately zero volts. Transistor Q3 thus functions to restore the high voltage level condition at the collector of transistor Q1 a short time delay after its transition to a low voltage level condition. Typical sampling pulses produced at the collector of transistor Q1 in response to $V_{CL}$ signals are shown in waveform B of FIG. 2. Emitter follower transistor Q5 translates or level shifts the $V_{CL}$ potential minus one $V_{BE}$ drop to line 7 when a DATA IN signal A is present at terminal 13.

In response to data input signals (A) of the type shown in waveform A of FIG. 2 and the sampling pulses (B) produced at the collector of transistor Q1, there is produced a sampled signal (S) on line 7 of the type shown in waveform S of FIG. 2.

The sampled signal (S) which may be expressed logically as S=A·B is at −1.6 volts (Lo) if, and only if, both the data input signal (A) applied to the base of transistor Q6 and the sampling pulse (B) applied to the base of transistor Q5 are simultaneously −0.8 volt. If either the signal A or the signal B is at zero volts (high) the signal S on line 7 is at −0.8 volt (high). Since the sampling pulses are very narrow, they determine the shape of the sampled signals S on line 7.

The signal produced at the emitter of transistor Q4 is shown in waveform R of FIG. 2. This signal is in phase with $V_{CL}$ and is substantially identical to that at the collector of transistor Q2 except for a negative direct curret (dc) level shift of 0.8 volt.

Gate 10 thus produces at one output (the collector of transistor Q1), a negative going pulse each time $V_{CL}$ goes positive and produces at another output (the collector of transistor Q2) a square wave similar to $V_{CL}$ but having sharper rise and fall times.

Since the signals produced at the collectors of transistors Q1 and Q2 and on lines 5 and 7 are produced by the same gate 10, the delay between the negative going edge of the sampling signals (B) and the positive going edge of a corresponding square wave signal (R) is very small. Measurements made on an experimental circuit embodying the invention indicated that at the midpoints of the B or S and R wavefronts, as shown in FIG. 2, following time $T_0$, there was a delay of less than one nanosecond ($1 \times 10^{-9}$ seconds) between their leading edges. Thus, two non-complementary signals having a high degree of leading edge time coincidence are generated. As further detailed below, the signals on line 7 and 5 may be used to set and reset, respectively, flip flop 20. The setting and resetting of the flip flop establishes the pulse width of an output pulse sensed by differential gate 30. The pulse width of the output pulse is well controlled and may be as accurate as the pulse width of the clocking signal ($V_{CL}$) or any other selected source of excitation signal.

A narrow sampling pulse (B) is advantageous when it is desirable and/or necessary to sample a signal for only a brief period of time. This is so when, as in this application (though the invention is in no way limited thereto), the data input pulses may have different rise and fall times, may be irregular and noisy and not exactly repetitive. Also, as may be seen from FIG. 2, the low level of the data input does not normally exist for the full length of a $V_{CL}$ pulse or an R pulse. However, a "low" level on waveform A, if present, is normally present when the waveform $V_{CL}$ makes a positive going transistion. Therefore, it is preferable that the data input be sampled for only a brief instant during the positive going transition of the $V_{CL}$ signal. It should be appreciated that the pulse width of the sampling pulse (B) is determined by timing capacitor C1 and timing resistor R5.

It should also be appreciated that the pulse forming network connected between the emitter of transistor Q4 and the collector of transistor Q1 provides a function normally produced by a one-shot (monostable multivibrator). Thus, gate 10 functions as a combinational gate.

In this application, a particular $V_{CL}$ signal was applied to the gate 10. It should be appreciated that any signal level or pulse could, instead, be applied as the control signal to terminal 11. A sampling pulse (due to one-shot action) would be produced at one output each time the control or excitation signal changed from a level of −1.6 volts to −0.8 volt, and a signal in phase with the control signal but having faster rise and fall times would be produced at the other output.

It should also be mentioned that additional transistors such as QX, shown in phantom view, could have their conduction paths connected in parallel with transistors Q5 and Q6 with independent control signals applied to their bases. Similarly, additional transistors such as QY, shown in phantom view, could have their conduction paths connected in parallel with transistor Q4 with independent control signals applied to their bases.

The set-reset flip-flop 20 includes transistors Q8 and Q10 having their emitters connected in common to a source 21 of relatively constant current, $I_x$. The source 21 includes: 1) transistor Q11 connected at its collector to the emitters of transistors Q8 and Q10; 2) resistor R8 connected between the emitter of transistor Q11 and conductor 12; 3) base bias resistor R9 connected between conductor 14 and the base of transistor Q11; and 4) diode D6 and resistor R10 connected in series between the base of transistor Q11 and conductor 12. A resistor R11 is connected between the collector of transistor Q8 and line 7 and a resistor R12 is connected between the collector of transistor Q10 and line 5. Transistors Q8 and Q10 are cross-coupled by means of emitter follower transistors Q7 and Q9 and diodes D4 and D5. Transistor Q7 is connected at its base to the collector of transistor Q8, at its collector to line 7 and at its emitter to the anode of diode D4. Diode D4 is connected at its cathode to the base of transistor Q10. Transistor Q9 is connected at its base to the collector of transistor Q10, at its collector to line 5 and at its emitter to the anode of diode D5. Diode D5 is connected at its cathode to the base of transistor Q8. The two outputs E and Ē of the flip-flop are taken at the bases of transistors Q8 and Q10 respectively. Output load resistors R13 and R14 are connected between the bases of transistor Q8 and Q10, respectively, and conductor 12.

The flip-flop is set by the application of a negative going signal (S) on line 7. The flip-flop is reset by the negative going trailing edge of signal (R) on line 5.

The differential gate circuit 30, which senses, differentially, the outputs of flip flop 20, includes transistor Q12 and Q13 connected at their bases to the bases of transistors Q10 and Q8, respectively. The collectors of transistors Q12 and Q13, at which are produced two outputs, F and F̄, respectively, are returned via resistors R15 and R16, respectively, to conductor 14. Transistors Q12 and Q13 are connected at their emitters to a source 31 of relatively constant current $I_G$. Source 31 includes: a) transistor Q14 connected at its collector to the emitters of transistors Q12 and Q13 and at its emitter via resistor R17 to conductor 12; b) base bias resistor R18 connected between terminal 19, to which is applied a positive source of potential, and the base of transistor Q14; and c) diode D7 and resistor R19 connected between the base of transistor Q14 and conductor 12.

The setting and resetting of flip flop 20 by means of ECL gate 10 is illustrated in the waveforms of FIG. 2. As shown for times $t_0$ and $t_4$, when a data input signal (A) and a sampling pulse (B) of −0.8 volt amplitude are present, the sampled signal (S) on line 7 makes a negative going excursion from −0.8 volt to −1.6 volts and sets E to −2.4 volts and Ē to −3.6 volts. Upon the termination of the sampled signals at times $t_A$ and $t_B$, E remains at −2.4 volts. Each time the signal (R) on line 5 makes a negative going excursion from −0.8 volt to −1.6 volts (e.g. times $t_1$, $t_3$, $t_5$), E is reset to −3.6 volts and Ē goes to −2.4 volts. When R returns to −0.8 volt E returns to −2.8 volts as shown at time $t_2$ if no sampled pulse is present.

In the circuit of FIG. 1, E is high (−2.4 volts) only for a period T1 beginning with a negative going excursion of S and terminating with the negative going excursion of R. The voltage level at E is normally low (−2.8 or −3.6 volts) with respect to Ē except for a period T1 following the concurrent presence of a data input signal and a sampling pulse. Flip-flop 20 in combination with ECL gate 10 thus produces pulses of controlled width.

As may be observed from the waveforms of FIG. 2, the output data pattern is not immediately apparent due, in part, to the voltage level variations in E and Ē and, in part, to the clocking pulses. The use of differential gate 30 to sense the state of the flip-flop eliminates possible ambiguities due to the voltage variations in the low levels of the E and Ē outputs.

The E and Ē outputs are applied to the base of transistor Q13 and Q12, respectively. The current source current $I_G$ flows through the collector-to-emitter path of transistor Q12 and resistor R15 if E is more positive than Ē and flows through the collector-to-emitter path of transistor Q13 and resistor R16 when Ē is more positive than E. $I_G$ is set by the selection of the value of potential applied to terminal 19 and the values of resistors R17, R18 and R19. Assume that $I_G$ is 1 milliampere and that resistors R15 and R16 are 800 ohms. In that case, a 0.8 volt drop is produced across that one of resistor R15 or R16 through which $I_G$ flows. In response to E high and Ē low, a positive going signal (−0.8 volt to zero volts) is produced at F and a negative going signal (0 to −0.8 volt) is produced at F̄. The F and F̄ outputs pulses produced in response to the presence of each sampled pulse are shown in FIG. 2. Each pulse has a unique voltage level for a given logic condition being either, approximately zero volts or, approximately, −0.8 volt. These levels were selected, because of their compatibility with conventional ECL gates.

It should also be appreciated that emitter follower transistors Q4, Q5 and Q6 serve to supply both the operating potential and the set and reset signals to the flip flop. Thus, transistors Q5 and Q6 may be viewed as supplying the potential to one side or branch of the flip flop and transistor Q4 may be viewed as supplying the potential to the other side or branch of the flip flop. When signals are applied to the bases of transistor Q4, Q5 and Q6, they translate those signals to potential changes at their emitters. These potential changes alter the value of the potential applied to that branch of the flip flop to which the emitter is connected. Thus, the set and reset signals applied to lines 5 and 7 are in fact alterations or changes in the positive potential levels on those lines.

What is claimed is:

1. In combination with a differential stage having first and second inputs and first and second outputs, the improvement comprising;
    means for producing a relatively short width pulse at said first output when its potential makes a transition from a first to a second level and the potential at the second output makes a transition from said second level to said first level including:
    a. a first means having a control electrode and having a conduction path connected between said first output and a point of fixed potential for reestablishing said first level at said first output when said conduction path is conductive;
    b. a delay network, coupled to the control electrode of said first means, for delaying the turn on of said conduction path until a set time after said delay network is enabled; and
    c. clamp means coupled between said second output and said delay network for disabling said delay network and preventing conduction through said conduction path when the potential at said second output is at said second level and for enabling said delay network when the second output is at said first level.

2. The improvement as claimed in claim 1, wherein said delay network includes a timing capacitor coupled at one end to the control electrode of said first means and connected at its other end to a point of fixed potential; and wherein said timing network includes means connected to said one end of said capacitor for charging said capacitor.

3. The improvement as claimed in claim 2 wherein said
first means is a transistor having base, emitter and collector, wherein said emitter and collector define the ends of said conduction path of said first means;
wherein the base of said transistor is the said control electrode thereof; and
wherein said clamp means is coupled between said second output and said one end of said capacitor.

4. The improvement as claimed in claim 3 wherein said clamp means includes an emitter follower transistor connected at its base to said second output, and a level shift network connected between the emitter of said follower transistor and said one end of said capacitor.

5. The improvement as claimed in claim 1 wherein said differential stage includes first and second bipolar transistors; each transistor having a base, an emitter, and a collector; wherein the base of said first transistor is connected to said first input, the base of said second transistor is connected to said second input, wherein the collector of said first transistor is connected to said first output and the collector of said second transistor is connected to said second output;
wherein a first load impedance is connected between the collector of said first transistor and a first operating potential receiving point, and a second load impedance is connected between the collector of said second transistor and said first operating potential receiving point; and
wherein means for producing a relatively constant current is connected between the emitters of said first and second transistors and a second operating potential receiving point.

6. The improvement as claimed in claim 5, wherein said first means includes a third transistor having its emitter-to-collector path connected between said first output and said point of fixed potential;
wherein said delay network includes a timing resistor connected in series with a timing capacitor between said point of fixed potential and one of said first and second operating potential receiving points;
wherein the junction of said timing capacitor and timing resistor is coupled to the base of said third transistor; and
wherein said clamp network includes a fourth transistor operated as an emitter follower, and a level shift network connected between the emitter of said fourth transistor and the junction of said timing capacitor and timing resistor.

7. The combination as claimed in claim 1 further including:
a first emitter follower having its base connected to said first output and its emitter connected to a first output line; and
a second emitter follower having its base connected to a data input terminal and its emitter connected to said first output line, whereby the signal produced on said first output line is a function of the signals at said first output and at said data input terminal.

8. The combination as claimed in claim 7 further including
a third emitter follower having its base connected to said second output and its emitter connected to a second output line.

9. The combination, as claimed in claim 7 further including a flip flop having a set input and a reset input and wherein one of said first and second output lines is connected to said set input and the other one of said first and second output lines is connected to said reset input.

* * * * *

UNITED STATES PATENT OFFICE
CERTIFICATE OF CORRECTION

Patent No. 4,001,608      Dated January 4, 1977

Inventor(s) Borys Zuk

It is certified that error appears in the above-identified patent and that said Letters Patent are hereby corrected as shown below:

Col. 1, line 55 "(F, F)" should read --- (F, $\bar{F}$) ---

Col. 3, line 51 "$V_{\underline{BE}}$" should read --- $V_{BE}$ ---.

line 59 "S=A·B" should read --- S=$\bar{A}\cdot\bar{B}$ ---

Col. 4, line 3 "curret" should read --- current ---.

line 17 "$T_0$" should read --- $t_0$ ---.

line 37 "$V_{\underline{CL}}$" should read --- $V_{CL}$ ---.

Col. 5, line 26 "E and E" should read --- E and $\bar{E}$ ---.

line 39 "F and F" should read --- F and $\bar{F}$ ---.

line 57 "E" (second occurrence) should read --- $\bar{E}$ ---.

line 62 "E" should read --- $\bar{E}$ ---.

UNITED STATES PATENT OFFICE
CERTIFICATE OF CORRECTION

Patent No. 4,001,608  Dated January 4, 1977

Inventor(s) Borys Zuk

It is certified that error appears in the above-identified patent and that said Letters Patent are hereby corrected as shown below:

Col. 6, line 1 "E" should read --- $\overline{E}$ ---.
    line 7 "E and E" should read --- E and $\overline{E}$ ---.
    line 11 "E and E" should read --- E and $\overline{E}$ ---.
    line 12 "E and E" should read --- E and $\overline{E}$ ---.
    line 15 "E" should read --- $\overline{E}$ ---.
    line 18 "E" should read --- $\overline{E}$ ---.
    line 24 "E low" should read --- $\overline{E}$ low ---.
    line 26 "F" (first occurrence) should read --- $\overline{F}$ ---.
    line 26 "F and F" should read --- F and $\overline{F}$ ---.

Signed and Sealed this second Day of August 1977

[SEAL]

Attest:

RUTH C. MASON
*Attesting Officer*

C. MARSHALL DANN
*Commissioner of Patents and Trademarks*